(12) United States Patent
Falk et al.

(10) Patent No.: US 12,015,185 B2
(45) Date of Patent: Jun. 18, 2024

(54) QUANTUM TRANSDUCERS WITH EMBEDDED OPTICAL RESONATORS

(71) Applicant: International Business Machines Corporation, Armonk, NY (US)

(72) Inventors: Abram L Falk, Port Chester, NY (US); Chi Xiong, Yorktown Heights, NY (US); Swetha Kamlapurkar, Yorktown Heights, NY (US); Hanhee Paik, Danbury, CT (US); Jason S. Orcutt, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 478 days.

(21) Appl. No.: 17/191,275

(22) Filed: Mar. 3, 2021

(65) Prior Publication Data
US 2022/0285818 A1    Sep. 8, 2022

(51) Int. Cl.
| | |
|---|---|
| *H01P 7/00* | (2006.01) |
| *G02B 6/12* | (2006.01) |
| *G02B 6/13* | (2006.01) |
| *H01P 11/00* | (2006.01) |

(52) U.S. Cl.
CPC ............... *H01P 7/00* (2013.01); *G02B 6/131* (2013.01); *H01P 11/008* (2013.01); *G02B 2006/1204* (2013.01)

(58) Field of Classification Search
CPC . H01P 7/00; H01P 11/008; H01P 7/08; G02B 6/131; G02B 2006/1204; H10N 69/00; G02F 1/035; G06N 10/40

USPC ......... 333/236, 238, 246, 4, 5, 33, 156, 161, 333/202–205, 99 S
See application file for complete search history.

(56) References Cited

U.S. PATENT DOCUMENTS

| | | |
|---|---|---|
| 4,879,533 A | 11/1989 | de Muro et al. |
| 6,066,598 A | 5/2000 | Ishikawa et al. |
| 6,187,717 B1 | 2/2001 | Wikborg et al. |

(Continued)

FOREIGN PATENT DOCUMENTS

| | | |
|---|---|---|
| CN | 106646738 A | 5/2017 |
| DE | 112017001164 T5 | 11/2018 |

(Continued)

OTHER PUBLICATIONS

Lu et al, "Schottky diodes from asymmetric melal-nanolube contacts," Appl Phys Lett 88, 133501 (2006), DOI:10.1063/1.2190707, 4 pages.

(Continued)

*Primary Examiner* — Rakesh B Patel
*Assistant Examiner* — Jorge L Salazar, Jr.
(74) *Attorney, Agent, or Firm* — Amin, Turocy & Watson, LLP

(57) ABSTRACT

Techniques regarding quantum transducers are provided. For example, one or more embodiments described herein can include an apparatus that can include a superconducting microwave resonator having a microstrip architecture that includes a dielectric layer positioned between a superconducting waveguide and a ground plane. The apparatus can also include an optical resonator positioned within the dielectric layer.

13 Claims, 10 Drawing Sheets

(56) References Cited

U.S. PATENT DOCUMENTS

| | | | |
|---|---|---|---|
| 6,678,540 B2 * | 1/2004 | Wire ..................... | H01P 1/047 333/260 |
| 6,734,638 B2 | 5/2004 | Kang et al. | |
| 6,920,253 B2 | 7/2005 | Tan et al. | |
| 7,889,992 B1 | 2/2011 | DiVincenzo et al. | |
| 7,941,014 B1 | 5/2011 | Watts et al. | |
| 8,447,145 B2 | 5/2013 | Goldring et al. | |
| 9,260,289 B2 | 2/2016 | Transducer | |
| 9,270,385 B2 | 2/2016 | Meyers et al. | |
| 9,296,609 B2 | 3/2016 | Park | |
| 9,350,460 B2 | 5/2016 | Paik | |
| 9,454,061 B1 | 9/2016 | Abdo et al. | |
| 9,660,721 B2 | 5/2017 | Polzik et al. | |
| 9,857,609 B2 | 1/2018 | Bishop et al. | |
| 9,885,888 B2 | 2/2018 | Bishop et al. | |
| 9,922,289 B2 | 3/2018 | Abdo | |
| 9,927,636 B2 | 3/2018 | Bishop et al. | |
| 10,295,582 B2 | 5/2019 | Bishop et al. | |
| 10,446,700 B2 | 10/2019 | Wang et al. | |
| 10,578,891 B1 | 3/2020 | Schmeing et al. | |
| 10,672,971 B2 | 6/2020 | Brink et al. | |
| 10,782,590 B2 | 9/2020 | Witmer et al. | |
| 10,858,240 B2 | 12/2020 | Painter et al. | |
| 2003/0057840 A1 | 3/2003 | Kang et al. | |
| 2005/0074194 A1 | 4/2005 | Tan et al. | |
| 2008/0310463 A1 | 12/2008 | Maleki et al. | |
| 2014/0314419 A1 | 10/2014 | Paik | |
| 2015/0055961 A1 | 2/2015 | Meyers et al. | |
| 2015/0060756 A1 | 3/2015 | Park | |
| 2017/0148972 A1 | 5/2017 | Thompson et al. | |
| 2017/0227795 A1 | 8/2017 | Bishop et al. | |
| 2017/0248832 A1 | 8/2017 | Kippenberg et al. | |
| 2017/0261770 A1 | 9/2017 | Bishop et al. | |
| 2017/0261771 A1 | 9/2017 | Bishop et al. | |
| 2018/0003753 A1 | 1/2018 | Bishop et al. | |
| 2018/0101787 A1 | 4/2018 | Abdo | |
| 2018/0113373 A1 | 4/2018 | Witmer et al. | |
| 2018/0247974 A1 | 8/2018 | Oliver et al. | |
| 2019/0043919 A1 | 2/2019 | George et al. | |
| 2019/0067779 A1 | 2/2019 | U-Yen et al. | |
| 2019/0147359 A1 | 5/2019 | Chen et al. | |
| 2019/0296210 A1 | 9/2019 | Brink et al. | |
| 2020/0321506 A1 | 10/2020 | Kelly et al. | |
| 2022/0146905 A1 | 5/2022 | Falk et al. | |

FOREIGN PATENT DOCUMENTS

| | | |
|---|---|---|
| EP | 0 735 606 B1 | 1/2002 |
| EP | 3 094 998 B1 | 4/2019 |
| WO | 2017/131831 A2 | 8/2017 |
| WO | 2018002770 A1 | 1/2018 |
| WO | 2019/213140 A1 | 11/2019 |
| WO | 202018095 A1 | 1/2020 |
| WO | 2020180956 A1 | 9/2020 |

OTHER PUBLICATIONS

Bullock et al, "Effcienl silicon solar cells with dopant-free asymmetric heleroconlacts," Nature Energy 1, 15031 (2016), 7 pages.
Rabbani, et al, "Pholoresponse of silicon with asymmetric area contacts," Semiconductor Sci. Techn. 32, 015001 (2016), 7 pages.
Kiong et al, "Microwave-To-Optical Quantum Transducers", U.S. Appl. No. 17/191, 178, filed Mar. 3, 2021, 39 pages.
Falk et al, "Active Electro-Optic Quantum Transducers Comprising Resonators With Switchable Nonlinearities," U.S. Appl. No. 17/094,365, filed Nov. 10, 2020, 45 pages.
Konaka et al., "Characteristics of microwave planar transmission lines using superconducting oxide films", Electronics and Communications in Japan (Part II: Electronics), vol. 75, No. 8, Aug. 1, 1992, pp. 83-94.
International Search Report and Written Opinion received for PCT Application Serial No. PCT/EP2022/054847 dated Jul. 7, 2022, 14 pages.
Tsioutsios et al., "Free-standing silicon shadow masks for transmon qubit fabrication", arxiv.org, Cornell University Library, 201 Olin Library Cornell University Ithaca, NY 14853, Aug. 16, 2020, doi: 10.1063/1.5138953, 8 pages.
Mirhosseini, et al. "Superconducting qubit to optical photon transduction." Nature 588.7839 (2020): 599-603.
Xu, et al. "Bidirectional electro-optic conversion reaching 1% efficiency with thin-film lithium niobate." arXiv preprint arXiv:2012.14909 (2020).
Orcutt, et al, "Engineering electro-optics in SiGe/Si waveguides for quantum transduction," Quant. Sci. Tech, 5, 034006 (2020).
Gentry, et al. "Monolithic source of entangled photons with integrated pump rejection." CLEO: Applications and Technology. Optical Society of America, 2018.
Andrews, et al., "Bidirectional and efficient conversion between microwave and optical light," arXiv:1310.5276v2 [physics.optics] Aug. 11, 2014, 17 pages.
Mckenna et al. | Cryogenic microwave-to-optical conversion using a triply resonant lithium-niobate-on-sapphire transducer. Optica. vol. 7, No. 12, Dec. 2020, 9 pages. https://doi.org/10.1364/OPTICA.397235.
Witmer et al. | A silicon-organic hybrid platform for quantum microwave-to-optical transduction. Cornell University, Quantum Physics, Dec. 21, 2019, 31 pages. http://arxiv.org/abs/1912.10346.
Holzgrafe et al. | Cavity electro-optics in thin-film lithium niobate for efficient microwave-to-optical transduction. Cornell University, Quantum Physics, May 12, 2020, 19 pages. arXiv:2005.00939v2.
Orcutt et al. | Engineering electro-optics in SiGe/Si waveguides for quantum transduction. Quantum Sci. Technol., vol. 5, No. 3, 034006, May 5, 2020, 14 pages. https://iopscience.iop.org/article/10.1088/2058-9565/ab84c1/pdf.
Ex Parte Quayle Office Action received for U.S. Appl. No. 17/191,178, dated Dec. 2, 2022, 52 pages.
Notice of Allowance received for U.S. Appl. No. 17/191,178, dated Mar. 1, 2023, 16 pages.

* cited by examiner

| Microwave Resonator 116 Architecture | H1 (μm) | SP MW Field (V/m) | Effective Index |
|---|---|---|---|
| Microstrip | 5 | 0.25 | 2.69 |
| Microstrip | 10 | 0.12 | 2.61 |
| CPWG TE | 5 | 0.08 | 2.68 |
| CPWG TE | 10 | 0.05 | 2.62 |
| CPWG TM | 5 | 0.23 | 2.68 |
| CPWG TM | 10 | 0.12 | 2.62 |
| Twinstrip | 5 | 0.29 | 2.75 |
| Twinstrip | 10 | 0.14 | 2.67 |
| CPW | 5 | 0.12 | 2.51 |
| CPW | 10 | 0.06 | 2.52 |

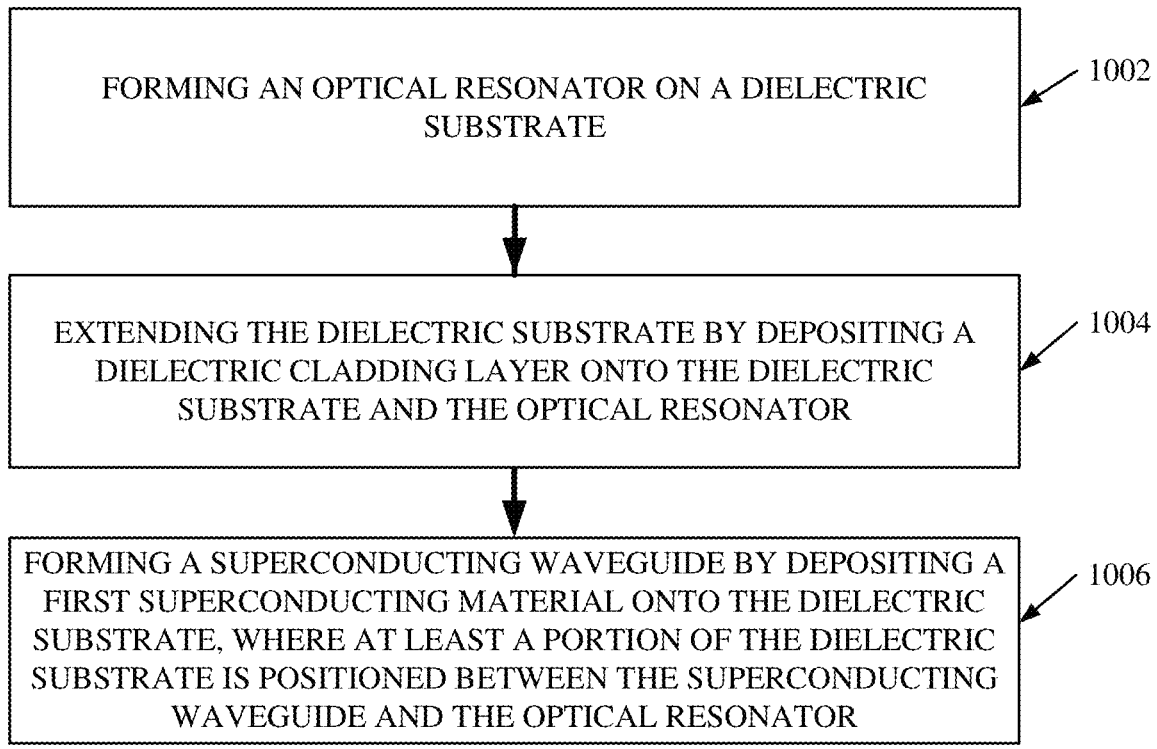

QUANTUM TRANSDUCERS WITH EMBEDDED OPTICAL RESONATORS

BACKGROUND

The subject disclosure relates to one or more quantum transducers with microstrip, co-planar, and/or twinstrip architectures, and more specifically, to quantum transducer architectures that include one or more optical resonators positioned adjacent to one or more superconducting microwave resonators and/or within a dielectric substrate.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatus, systems, devices, and/or methods regarding quantum transducers are described.

According to an embodiment, an apparatus is provided. The apparatus can comprise a superconducting microwave resonator having a microstrip architecture that includes a dielectric substrate positioned between a superconducting waveguide and a ground plane. The apparatus can also comprise an optical resonator positioned within the dielectric layer.

According to another embodiment, an apparatus is provided. The apparatus can comprise a superconducting microwave resonator having a twinstrip architecture that includes a dielectric layer positioned between a first superconducting waveguide and a second superconducting waveguide. Also, the apparatus can comprise an optical resonator positioned within the dielectric substrate.

According to an embodiment, a method is provided. The method can comprise forming an optical resonator on a dielectric substrate. Also, the method can comprise extending the dielectric substrate by depositing a dielectric cladding layer onto the dielectric substrate and the optical resonator. Further, the method can comprise forming a superconducting waveguide by depositing a first superconducting material onto the dielectric substrate. At least a portion of the dielectric substrate can be positioned between the superconducting waveguide and the optical resonator.

BRIEF DESCRIPTION OF THE DRAWINGS

FIG. 10 illustrates a flow diagram of an example, non-limiting method of manufacturing one or more quantum transducers in accordance with one or more embodiments described herein.

DETAILED DESCRIPTION

Figure 1A:
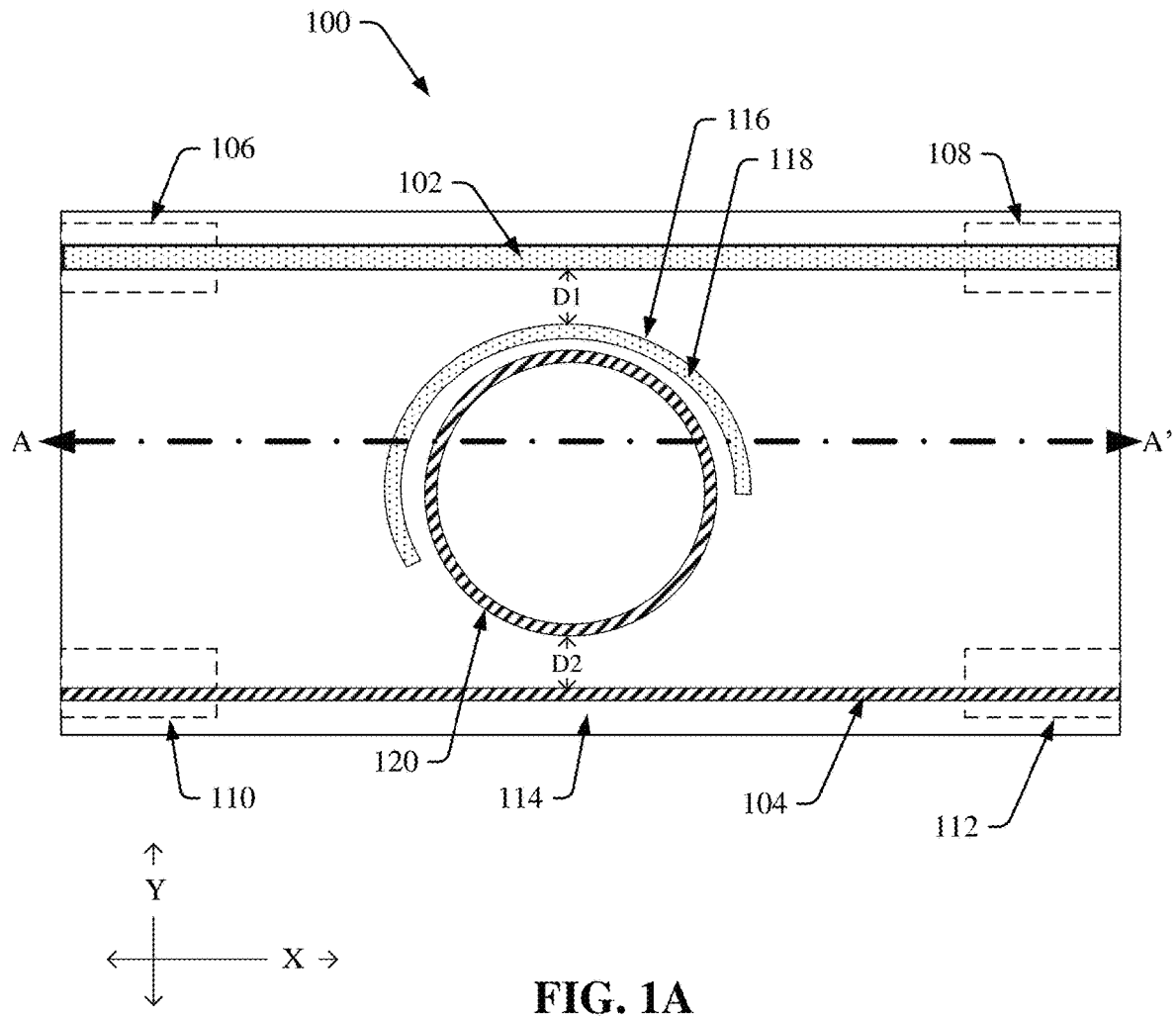
FIG. 1A illustrates a diagram of an example, non-limiting top-down view of a quantum transducer in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Long-distance networks of superconducting quantum computers can involve quantum transducers that convert single photons from microwave frequencies up to the infrared telecom domain. The energy of a microwave photon is less than the thermal background energy of room temperature; therefore, room-temperature quantum information links at microwave frequencies can be extremely challenging. However, infrared photons can travel long distances in optical fibers without attenuation or interference. Quantum transducers linked to other superconducting quantum processors can then convert the photon from the infrared back to the microwave domain.

There are several approaches to this problem. One is to use a mechanical resonator as a mediating degree of freedom between the microwave and optical domains. Others leverage the optical or spin transitions of atoms or solid-state defect centers, or magnon states. If optical and microwave resonators are coupled through a $X^{(2)}$ or $X^{(3)}$ non-linear optical medium, then the microwave and optical resonators can directly exchange energy without the need for a mediating degree of freedom. However, a challenge in electro-optic quantum transduction is the adequate confinement of the microwave field in order to improve efficiency of quantum transduction. The transduction efficiency is proportional to the square of the microwave-optical single photon coupling strength, which is inversely proportional to the square root of the microwave field mode volume. Thus, minimizing the microwave mode volume can achieve a high efficiency quantum transducer.

Various embodiments described herein can include apparatus, devices, systems, and/or methods regarding one or more quantum transducers that can rely on electro-optic coupling between one or more microwave resonator architectures and one or more optical resonators. In one or more embodiments, the one or more microwave resonator architectures can confine the microwave mode to a substrate of the quantum transducer, with a peak field centered within the substrate. In one or more embodiments, the one or more optical resonators can be positioned within a dielectric substrate and beneath one or more superconducting waveguides. The one or more superconducting waveguides can further be comprised within a microstrip, co-planar, and/or twinstrip microwave resonator architecture.

As described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "epitaxial growth process" and/or "epitaxial growth processes" can refer to any process that grows an epitaxial material (e.g., crystalline semiconductor material) on a deposition surface of another semiconductor material, in which the epitaxial material being grown has substantially the same crystalline characteristics as the semiconductor material of the deposition surface. In an epitaxial deposition process, chemical reactants provided by source gases (e.g., a silicon and/or germanium containing gas) and/or source liquids can be controlled, and the system parameters can be set, so that the depositing atoms arrive at the deposition surface with sufficient energy to move about on the surface and orient themselves to the crystal arrangement of the atoms of the deposition surface. Therefore, the grown epitaxial material has substantially the same crystalline characteristics as the deposition surface on which the epitaxial material is formed. For example, an epitaxially grown semiconductor material deposited on a <100> orientated crystalline surface can take on a <100> orientation. Example epitaxial growth processes can include, but are not limited to: vapor-phase epitaxy ("VPE"), molecular-beam epitaxy ("MBE"), liquid-phase epitaxy ("LPE"), combination thereof, and/or the like.

As described herein, the terms "etching process", "etching process", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

As described herein, the terms "lithography process" and/or "lithography processes" can refer to the formation of three-dimensional relief images or patterns on a semiconductor substrate for subsequent transfer of the pattern to the substrate. In semiconductor lithography, the patterns can be formed by a light sensitive polymer called a photo-resist. To build the complex structures that make up a semiconductor device and the many wires that connect the various features of a circuit, lithography processes and/or etch pattern transfer steps can be repeated multiple times. Each pattern being printed on the wafer can be aligned to the previously formed patterns and slowly the subject features (e.g., conductors, insulators and/or selectively doped regions) can be built up to form the final device.

As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

FIG. 1A illustrates a diagram of an example, non-limiting top-down view of an exemplary quantum transducer 100 in accordance with one or more embodiments described herein. Repetitive description of like elements employed in other embodiments described herein is omitted for sake of brevity. In various embodiments, the quantum transducer 100 can include one or more microwave transmission lines 102 and/or one or more optical waveguides 104. The one or more microwave transmission lines 102 can extend from, for example, a microwave input section, for example single microwave photon input section 106, to a microwave output section, for example single microwave photon output section 108. Similarly, the one or more optical waveguide 104 can extend from, for example, an optical input section, for example single optical photon input section 110 (e.g., coupled to a pump laser input), to an optical output section, for example single optical photon output section 112.

In one or more embodiments, the one or more microwave transmission lines 102 can comprise one or more superconducting materials. Example superconducting materials that can be comprised within the one or more microwave transmission lines 102 can include, but are not limited to: niobium, niobium nitride, titanium nitride, a combination thereof, and/or the like. The one or more microwave transmission lines 102 can have a thickness (e.g., along the "Y" axis shown in FIG. 1A) ranging from, for example, greater than or equal to 5 micrometers (μm) and less than or equal to 20 μm. In various embodiments, the one or more microwave transmission lines 102 can be positioned on a dielectric substrate 114. In one or more embodiments, the one or more optical waveguides 104 can comprise one or more transparent, and/or substantially transparent, materials.

Example materials that can be comprised within the one or more optical waveguides 104 can include, but are not limited to: silicon germanium, lithium niobate, aluminum nitride, a combination thereof, and/or the like. The one or more optical waveguides 104 can have a thickness (e.g., along the "Y" axis shown in FIG. 1A) ranging from, for example, greater than or equal to 1 μm and less than or equal to 10 μm. In various embodiments, the one or optical waveguides 104 can be positioned within the dielectric substrate 114.

The dielectric substrate 114 can be crystalline, semi-crystalline, microcrystalline, or amorphous. The dielectric substrate 114 can comprise essentially (e.g., except for contaminants) a single element (e.g., silicon or germanium) and/or a compound (e.g., aluminum oxide, silicon dioxide, gallium arsenide, silicon carbide, silicon germanium, a combination thereof, and/or the like). The dielectric substrate 114 can also have multiple material layers, such as, but not limited to: a semiconductor-on-insulator substrate ("SeOI"), a silicon-on-insulator substrate ("SOI"), germanium-on-insulator substrate ("GeOI"), silicon-germanium-on-insulator substrate ("SGOI"), a combination thereof, and/or the like. Additionally, the dielectric substrate 114 can also have other layers, such as oxides with high dielectric constants ("high-K oxides") and/or nitrides. In one or more embodiments, the dielectric substrate 114 can be a silicon wafer. In various embodiments, the dielectric substrate 114 can comprise a single crystal silicon (Si), silicon germanium (e.g., characterized by the chemical formula SiGe), a Group III-V semiconductor wafer or surface/active layer, sapphire, garnet, a combination thereof, and/or the like.

As shown in FIG. 1A, one or more microwave resonators 116 can be positioned adjacent to the one or more microwave transmission lines 102 and/or between the single microwave photon input section 106 and the single microwave photon output section 108. In one or more embodiments, the one or more microwave resonators 116 can comprise one or more superconducting waveguides 118. The one or more superconducting waveguides 118 can comprise one or more superconducting materials. Example superconducting materials that can be comprised within the one or more superconducting waveguides 118 can include, but are not limited to: niobium, niobium nitride, titanium nitride, a combination thereof, and/or the like. In various embodiments, the one or more superconducting waveguides 118 can be positioned on the dielectric substrate 114. In one or more embodiments, the one or more superconducting waveguides 118 can be spaced from the one or more microwave transmission lines 102 by at least a first distance D1 ranging from, for example, greater than or equal to 1 μm and less than or equal to 100 μm.

Additionally, in one or more embodiments, the one or more microwave resonators 116 can further include one or more ground planes positioned under the dielectric substrate 114. For clarity purposes, the one or more ground planes are not shown in FIG. 1A, but are depicted in the cross-sectional views of the quantum transducer 100 illustrated in FIGS. 2, 4-5, and 8-9.

Also shown in FIG. 1A, one or more optical resonators 120 can be positioned adjacent to the one or more optical waveguides 104 and/or between the single optical photon input section 110 and single optical photon output 112. In one or more embodiments, the one or more optical resonators 120 can comprise one or more transparent, and/or substantially transparent, materials. Example materials that can be comprised within the one or more optical resonators 120 can include, but are not limited to: silicon germanium, lithium niobate, aluminum nitride, a combination thereof, and/or the like. In various embodiments, the one or more optical resonators 120 can be positioned within the dielectric substrate 114. Additionally, the one or more optical resonators 120 can be spaced from the one or more optical waveguides 104 by at least a second distance D2 ranging from, for example, greater than or equal to 100 nanometers (nm) and less than or equal to 2 μm.

While FIG. 1A depicts the one or more superconducting waveguides 118 and/or optical resonators 120 having circular geometries, the architecture of the quantum transducer 100 is not so limited. For example, embodiments in which the one or more superconducting waveguides 118 and/or optical resonators 120 have alternate geometries (e.g., elliptical or polygonal geometries) are also envisaged. Further, while FIG. 1A depicts the one or more superconducting waveguides 118 and optical resonators 120 misaligned with each other, the architecture of the quantum transducer 100 is not so limited. For example, embodiments in which the one or more superconducting waveguides 118 and optical resonators 120 are aligned with each other are also envisaged (e.g., as described later herein).

Figure 1B:
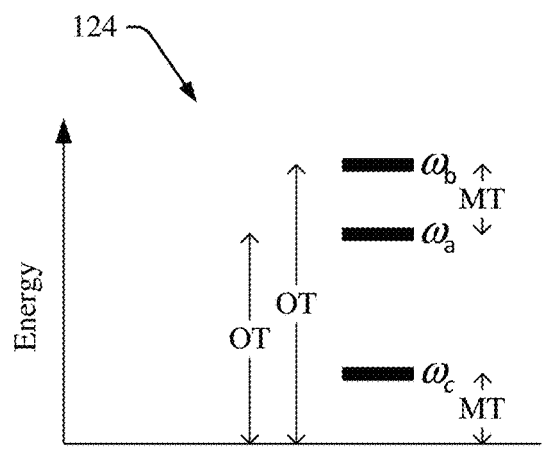
FIG. 1B illustrates a diagram of an example, non-limiting graph of optical and/or microwave transitions that can characterize operation of one or more quantum transducers in accordance with one or more embodiments described herein.

FIG. 1B illustrates a diagram of an example, non-limiting graph 124 that can depict optical and/or microwave transitions that can be experienced by the one or more quantum transducers 100 in accordance with one or more embodiments described herein. Repetitive description of like elements employed in other embodiments described herein is omitted for sake of brevity. Graph 124 can depict optical transitions (e.g., represented by "OT" arrows) that can be experienced by the quantum transducer 100 as the energy state of the one or more microwave resonators 116 and/or optical resonators 120 increases. Also, graph 124 can depict microwave transitions (e.g., represented by "MT" arrows) that can be experienced by the quantum transducer 100 as the energy state of the one or more microwave resonators 116 and/or optical resonators 120 increases. "$\omega_a$" can represent a first optical mode of the optical resonator 120, "$\omega_b$" can represent a second optical mode of the optical resonator 120, and "$\omega_c$" can represent a microwave mode of the microwave resonator 116.

Figure 2:
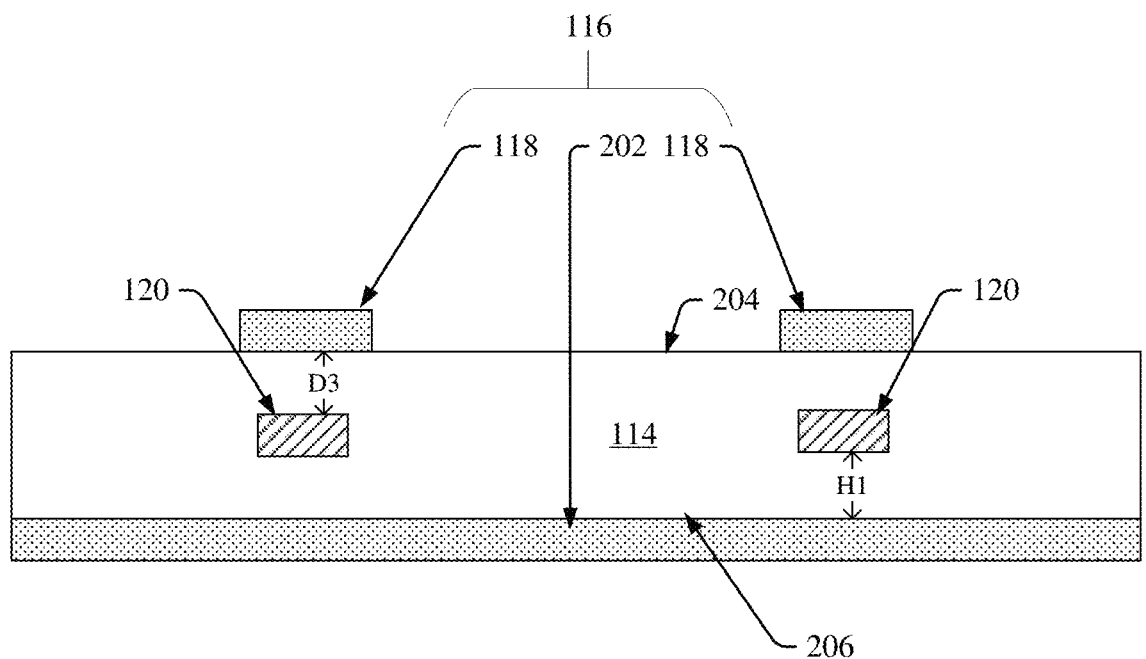
FIG. 2 illustrates a diagram of an example, non-limiting cross-sectional view of one or more quantum transducers having a microstrip architecture in accordance with one or more embodiments described herein.
Figure 2:
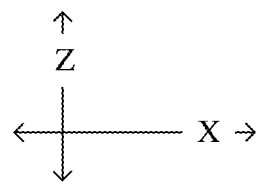

FIG. 2 illustrates a diagram of an example, non-limiting cross-sectional view of the quantum transducer 100 in accordance with one or more embodiments described herein. Repetitive description of like elements employed in other embodiments described herein is omitted for sake of brevity. FIG. 2 can depict a cross-section of the quantum transducer 100 along the A-A' plane depicted in FIG. 1A. As shown in FIG. 2, the one or more microwave resonators 116 can include the one or more superconducting waveguides 118 and a superconducting ground plane 202, separated from each other by the dielectric substrate 114. Thereby, the one or more microwave resonators 116 can have a microstrip architecture (e.g., as shown in FIG. 2).

In one or more embodiments, the superconducting ground plane 202 can comprise one or more superconducting materials. Example superconducting materials that can be comprised within the superconducting ground plane 202 can include, but are not limited to: niobium, niobium nitride, titanium nitride, a combination thereof, and/or the like. For instance, the one or more superconducting waveguides 118 and the superconducting ground plane 202 can have the same, or substantially the same, composition. Further, the superconducting ground plane 202 can have a thickness (e.g., along the "Z" axis shown in FIG. 2) ranging from, for example, greater than or equal to 50 nm and less than or equal to 5 μm.

In various embodiments, the one or more superconducting waveguides 118 can be positioned on the dielectric substrate 114, while the one or more optical resonators 120 can be positioned within the dielectric substrate 114. Thereby, the one or more superconducting waveguides 118 can be positioned above the one or more optical resonators 120 (e.g., along the "Z" axis depicted in FIG. 2). For example, the position of the one or more superconducting waveguides 118 can overlap the position of the one or more optical resonators 120 along a vertical plane (e.g., along the "Z" axis shown in FIG. 2). As shown in FIG. 2, the dielectric substrate 114 can house the one or more optical resonators 120. The one or more superconducting waveguides 118 can be positioned at a first surface 204 the dielectric substrate 114, while the superconducting ground plane 202 can be positioned at a second surface 206 the dielectric substrate 114. Further, the first surface 204 and the second surface 206 can be at opposite sides of the dielectric substrate 114.

In one or more embodiments, a width (e.g., along the "X" axis shown in FIG. 2) of the one or more superconducting waveguides 118 can be greater than a width (e.g., along the "X" axis shown in FIG. 2) of the one or more optical resonators 120 (e.g., as shown in FIG. 2). In one or more embodiments, the widths of the one or more superconducting waveguides 118 and/or optical resonators 120 can be equal. The width (e.g., along the "X" axis shown in FIG. 2) of the one or more superconducting waveguides 118 can range from, for example, greater than or equal to 3 μm and less than or equal to 20 μm (e.g., 4 micrometers (μm)). The width (e.g., along the "X" axis shown in FIG. 2) of the one or more optical resonators 120 can range from, for example, greater than or equal to 1 μm and less than or equal to 10 μm (e.g., 3 μm).

In one or more embodiments, a thickness (e.g., along the "Z" axis shown in FIG. 2) of the one or more superconducting waveguides 118 can be greater than a thickness (e.g., along the "Z" axis shown in FIG. 2) of the one or more optical resonators 120. In one or more embodiments, the widths of the one or more superconducting waveguides 118 and/or optical resonators 120 can be equal (e.g., as shown in FIG. 2). The thickness (e.g., along the "Z" axis shown in FIG. 2) of the one or more superconducting waveguides 118 can range from, for example, greater than or equal to 50 nm and less than or equal to 5 μm. The thickness (e.g., along the "Z" axis shown in FIG. 2) of the one or more optical resonators 120 can range from, for example, greater than or equal to 100 nm and less than or equal to 1 μm (e.g., 0.5 μm).

In various embodiments, the one or more optical resonators 120 can be positioned within the dielectric substrate 114 at a height H1 from the superconducting ground plane 202 ranging from, for example, greater than or equal to 1 μm and less than or equal to 10 μm (e.g., 10 μm). Additionally, the one or more optical resonators 120 can be vertically spaced (e.g., along the "Z" axis shown in FIG. 2) from the one or more superconducting waveguides 118 by a third distance D3 ranging from, for example, greater than or equal to 1 and less than or equal to 10 μm (e.g., 9.5 μm).

Figure 3:
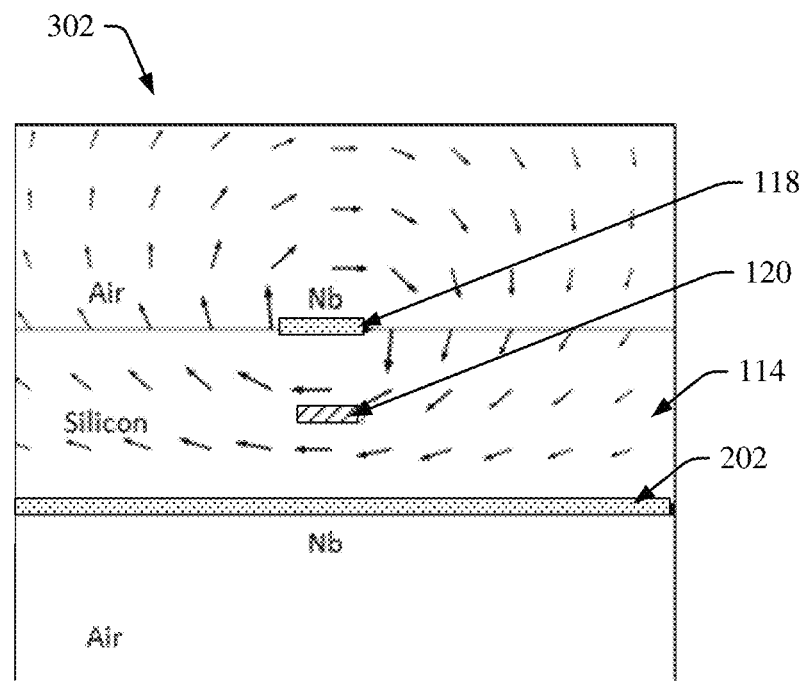
FIG. 3 illustrates a diagram of example, non-limiting simulations depicting a magnetic field and/or electric field that can characterize operation of one or more quantum transducers in accordance with one or more embodiments described herein.
Figure 3:
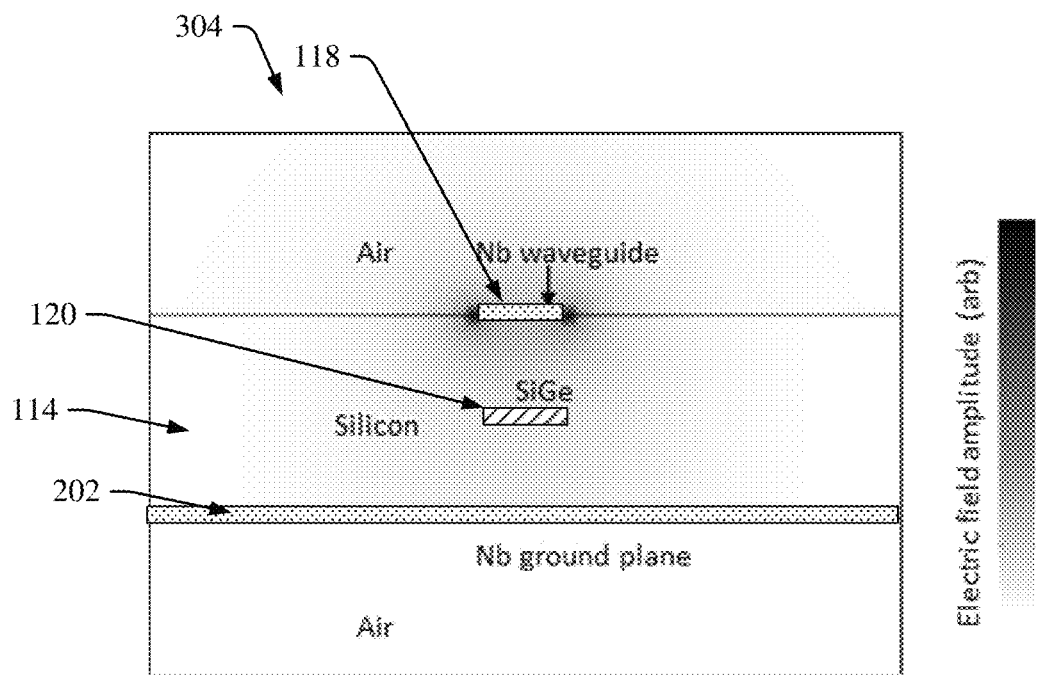

FIG. 3 illustrates a diagram of example, non-limiting simulations 302 and/or 304 depicting a magnetic field and/or electric field that can be achieved by the one or more quantum transducers 100 having one or more microwave resonators 116 with a microstrip architecture in accordance with one or more embodiments described herein. Repetitive description of like elements employed in other embodiments described herein is omitted for sake of brevity. Simulation 302 can regard a magnetic field that can be achieved by the one or more quantum transducers 100 having one or more microwave resonators 116 with a microstrip architecture, and/or simulation 304 can regard an electric field that can be achieved by the one or more quantum transducers 100 having one or more microwave resonators 116 with a microstrip architecture. Simulations 302 and/or 304 can be generated using a two-dimensional finite-difference element ("FDE") solver, where the inputs can be: the width (e.g., along the "X" axis shown in FIG. 2) of the one or more superconducting waveguides 118; the thickness (e.g., along the "Z" axis shown in FIG. 2) of the dielectric substrate 114; and/or the width (e.g., along the "X" axis shown in FIG. 2) of the one or more optical resonators 120. The outputs of the solver can be the spatial distributions of the mode's electric and/or magnetic fields, and the effective mode index. Various embodiments described herein, can employ a width (e.g., along the "X" axis shown in FIG. 2) of the one or more superconducting waveguides 118 that can achieve the highest electric field in the optical field overlap region (e.g., the effective index of the optimized width of the one or more superconducting waveguides 118 can be 2.744).

Figure 4A:
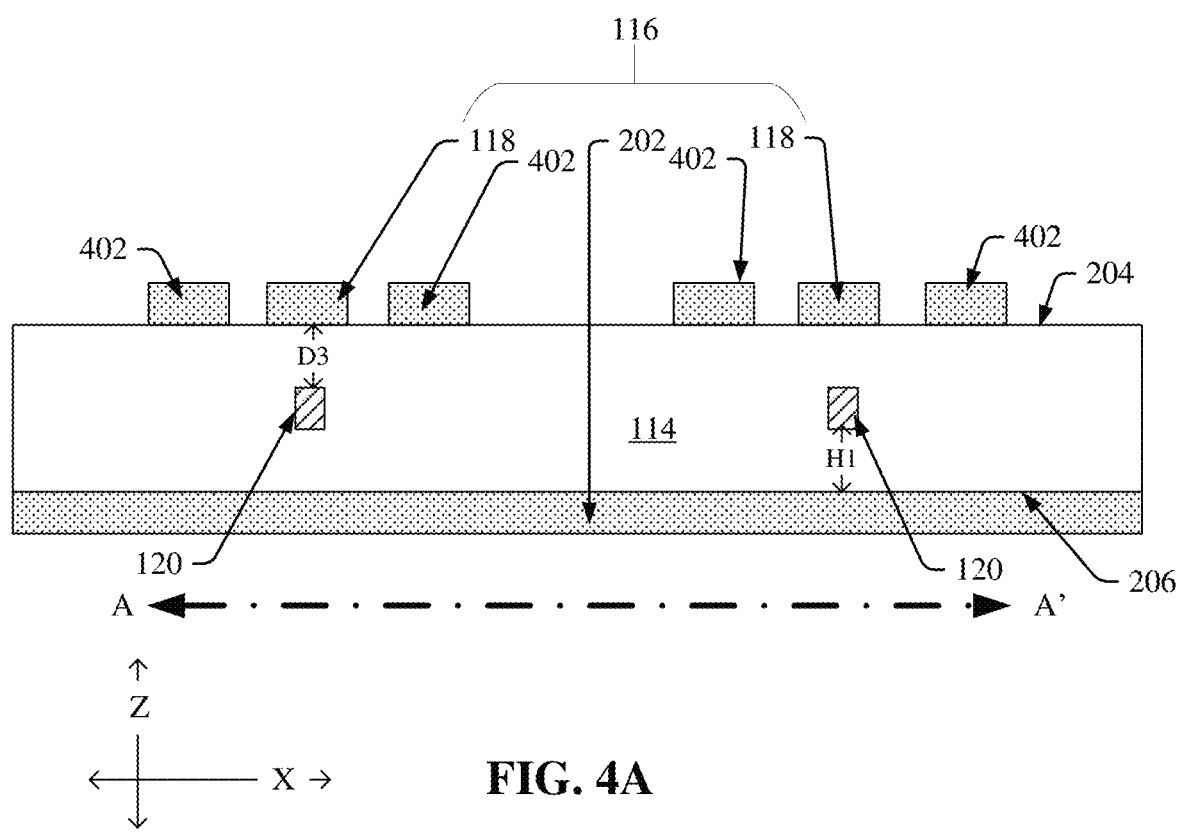
FIGS. 4A-4B illustrate diagram of example, non-limiting cross-sectional views of one or more quantum transducers having a co-planar waveguide architecture in accordance with one or more embodiments described herein.
Figure 4B:
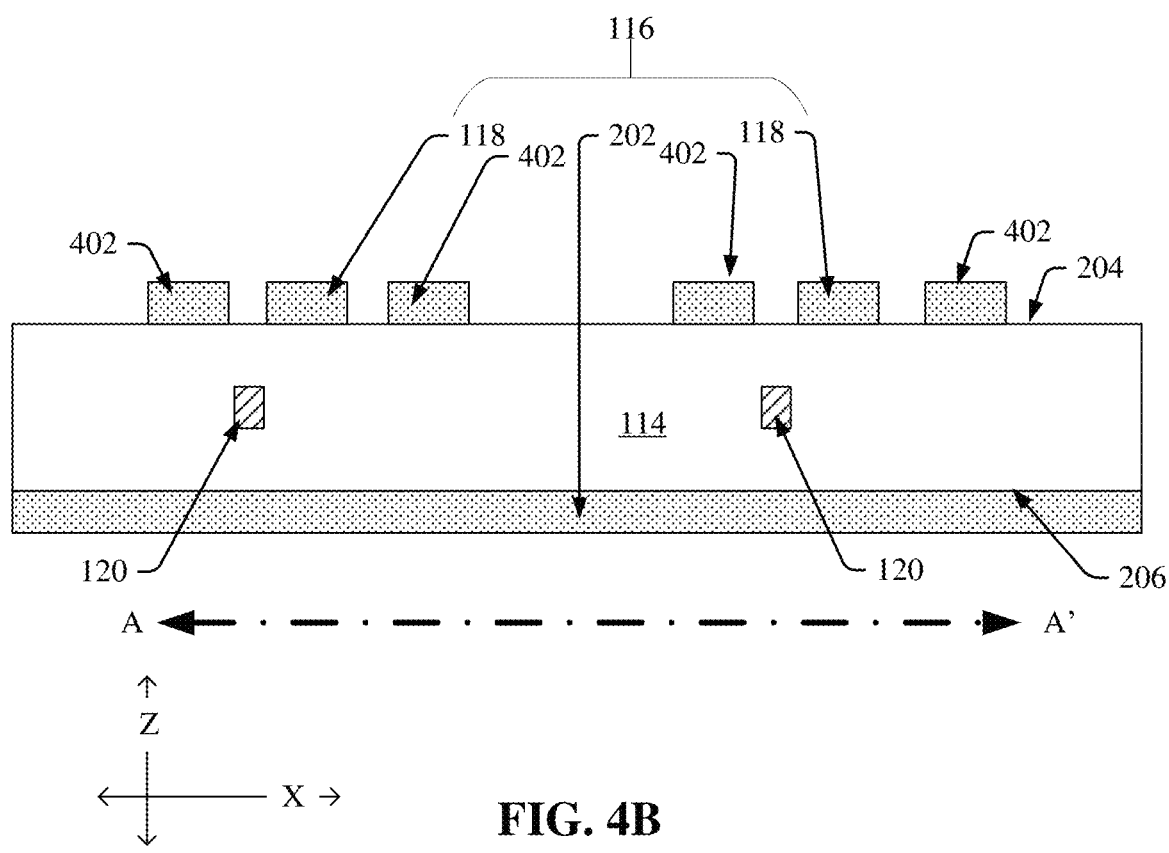

FIGS. 4A-4B illustrate diagrams of example, non-limiting cross-sectionals view of the quantum transducer 100 in accordance with one or more embodiments described herein. Repetitive description of like elements employed in other embodiments described herein is omitted for sake of brevity. FIGS. 4A-4B can depict a cross-section of the quantum transducer 100 along the A-A' plane depicted in FIG. 1A. As shown in FIGS. 4A-4B, the one or more microwave resonators 116 can include the one or more superconducting waveguides 118, superconducting ground plane 202, and/or one or more second superconducting ground planes 402. The one or more superconducting waveguides 118 and second superconducting ground planes 402 can be separated from the superconducting ground plane 202 by the dielectric substrate 114. Thereby, the one or more microwave resonators 116 can have a co-planar waveguide ("CPW") architecture (e.g., as shown in FIG. 4).

In one or more embodiments, the one or more second superconducting ground planes 402 can comprise one or more superconducting materials. Example superconducting materials that can be comprised within the one or more second superconducting ground planes 402 can include, but are not limited to: niobium, niobium nitride, aluminum nitride, a combination thereof, and/or the like. For instance, the one or more superconducting waveguides 118, the superconducting ground plane 202, and the one or more second superconducting ground planes 402 can have the same, or substantially the same, composition. Further, the one or more second superconducting ground planes 402 can have a thickness (e.g., along the "Z" axis shown in FIG. 4) ranging from, for example, greater than or equal to 50 nm and less than or equal to 5 μm.

As shown in FIG. 4, the one or more second superconducting ground planes 402 can be positioned on the dielectric substrate 114 adjacent to the one or more superconducting waveguides 118. Also, the one or more second superconducting ground planes 402 can be horizontally spaced (e.g., along the "X" axis shown in FIG. 4) from the one or more superconducting waveguides 118 by a distance ranging from, for example, greater than or equal to 2 μm and less than or equal to 20 μm. In FIG. 4A the quantum transducer 100 can have a co-planar waveguide with ground ("CPWG") transverse electric ("TE") mode configuration. As shown in FIG. 4A, the one or more optical resonators 120 can be positioned directly below the one or more superconducting waveguides 118 (e.g., the one or more optical resonators 120 can be vertically aligned, along the "Z" axis, with the one or more superconducting waveguides 118). In FIG. 4B the quantum transducer 100 can have a CPWG transverse magnetic ("TM") mode configuration. As shown in FIG. 4B, the one or more optical resonators 120 can be positioned offset from the one or more superconducting waveguides 118 along the vertical plane (e.g., along the "Z" axis shown in FIG. 4B).

Figure 5:
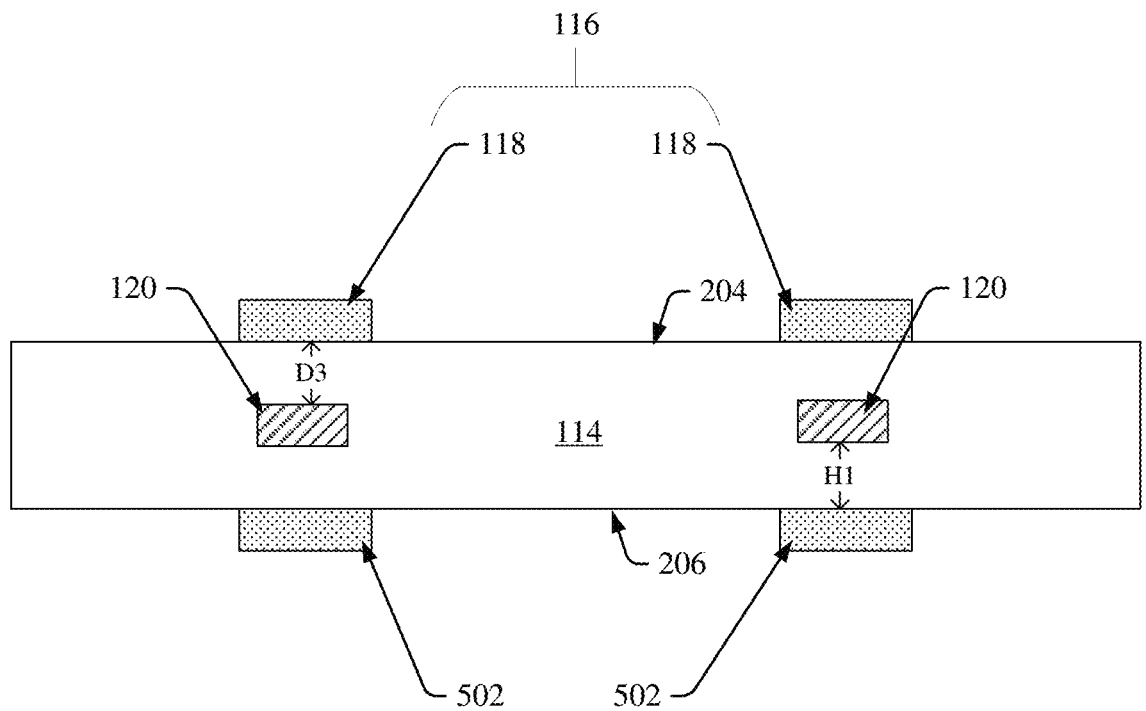
FIG. 5 illustrates a diagram of an example, non-limiting cross-sectional view of one or more quantum transducers having a twinstrip architecture in accordance with one or more embodiments described herein.

FIG. 5 illustrates a diagram of an example, non-limiting cross-sectional view of the quantum transducer 100 in accordance with one or more embodiments described herein. Repetitive description of like elements employed in other embodiments described herein is omitted for sake of brevity. FIG. 5 can depict a cross-section of the quantum transducer 100 along the A-A' plane depicted in FIG. 1A. As shown in FIG. 5, the one or more microwave resonators 116 can include the one or more superconducting waveguides 118 and one or more second superconducting waveguides 502, separated from each other by the dielectric substrate 114. Thereby, the one or more microwave resonators 116 can have a twinstrip architecture (e.g., as shown in FIG. 5).

For example, with the twinstrip architecture, the one or more second superconducting waveguides 502 can replace the superconducting ground plane in the microstrip architecture. For instance, the one or more second superconducting waveguides 502 can be positioned on the second surface 206 of the dielectric substrate. The one or more second superconducting waveguides 502 can comprise one or more superconducting materials. Example superconducting materials that can be comprised within the one or more second superconducting waveguides 502 can include, but are not limited to: niobium, niobium nitride, titanium nitride, a combination thereof, and/or the like. The one or more second superconducting waveguides 502 can have a thickness (e.g., along the "Z" axis shown in FIG. 5) ranging from, for example, greater than or equal to 50 nm and less than or equal to 5 μm. Also, the one or more second superconducting waveguides 502 can have a width (e.g., along the "X" axis shown in FIG. 5) ranging from, for example, greater than or equal to 3 μm and less than or equal to 20 μm (e.g., 4 μm). In one or more embodiments, the one or more second superconducting waveguides 502 can have the same, or substantially the same, composition and/or dimensions as the one or more superconducting waveguides 118.

As shown in FIG. 5, the one or more superconducting waveguides 118 and/or second superconducting waveguides 502 can be aligned with each other in a vertical plane (e.g., along the "Z" axis shown in FIG. 5). In one or more embodiments, the one or more optical resonators 120 can be positioned directly between the one or more superconducting waveguides 118 and second superconducting waveguides 502 (e.g., as shown in FIG. 5).

Figure 6:
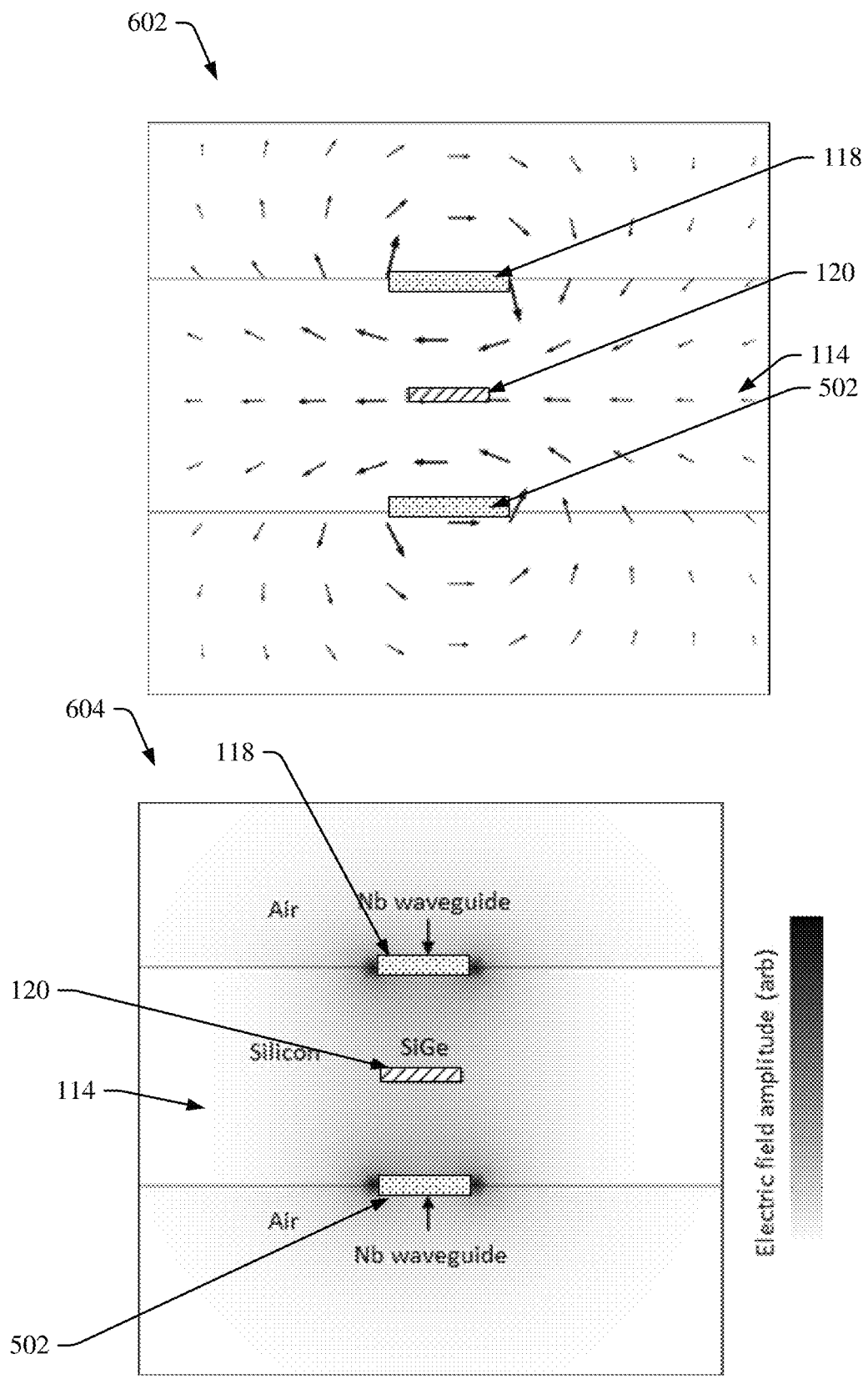
FIG. 6 illustrates a diagram of example, non-limiting simulations depicting a magnetic field and/or electric field that can characterize operation of one or more quantum transducers in accordance with one or more embodiments described herein.

FIG. 6 illustrates a diagram of example, non-limiting simulations 602 and/or 604 depicting a magnetic field and/or electric field that can be achieved by the one or more quantum transducers 100 having one or more microwave resonators 116 with a twinstrip architecture in accordance with one or more embodiments described herein. Repetitive description of like elements employed in other embodiments described herein is omitted for sake of brevity. Simulation 602 can regard a magnetic field that can be achieved by the one or more quantum transducers 100 having one or more microwave resonators 116 with a twinstrip architecture, and/or simulation 604 can regard an electric field that can be achieved by the one or more quantum transducers 100 having one or more microwave resonators 116 with a twinstrip architecture. Simulations 602 and/or 604 can be generated using a two-dimensional FDE solver, where the inputs can be: the width (e.g., along the "X" axis shown in FIG. 5) of the one or more superconducting waveguides 118; the thickness (e.g., along the "Z" axis shown in FIG. 5) of the dielectric substrate 114; the width (e.g., along the "X" axis shown in FIG. 5) of the one or more optical resonators 120; and/or the width (e.g., along the "X" axis shown in FIG. 5) of the one or more second superconducting waveguides 502. The outputs of the solver can be the spatial distributions of the mode's electric and/or magnetic fields, and the effective mode index. Various embodiments described herein, can employ a width (e.g., along the "X" axis shown in FIG. 5) of the one or more superconducting waveguides 118 and/or second superconducting waveguides 502 that can achieve the highest electric field in the optical field overlap region (e.g., the effective index of the optimized width of the one or more superconducting waveguides 118 and/or second superconducting waveguides 502 can be 2.82).

Figure 7:
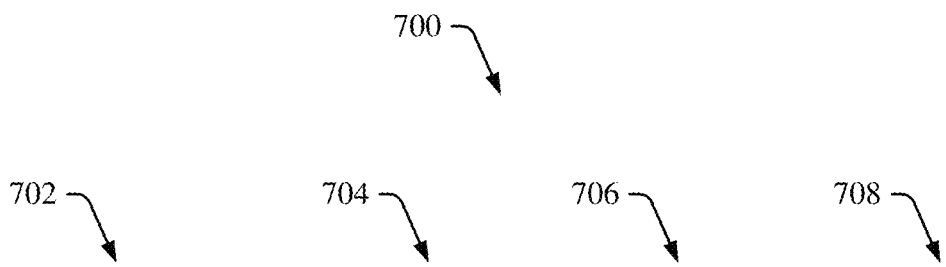
FIG. 7 illustrates a diagram of an example, non-limiting table that can demonstrate the efficacy of one or more quantum transducers in accordance with one or more embodiments described herein.

FIG. 7 illustrates a diagram of an example, non-limiting table 700 that can depict the effect of varying the first height H1 of the one or more optical resonators 120 in accordance with various embodiments described herein. Repetitive description of like elements employed in other embodiments described herein is omitted for sake of brevity. Table 700 depicts the results of multiple simulations executed with a two-dimensional FDE solver, such as the simulations 302, 304, 602, and/or 604 depicted in FIGS. 3 and/or 6. The first column 702 of table 700 can delineate the architecture of the microwave resonator 116 employed in the respective simulation (e.g., a microstrip architecture, a CPWG TE architecture, a CPWG TM architecture, a twinstrip architecture, and/or a co-planar waveguide ("CPW") architecture (e.g., such as a CPWG structure without the superconducting ground plane)). The second column 704 of table 700 can delineate the height H1 of the one or more optical resonators 120. The third column 706 of table 700 can delineate the single-photon microwave ("SP MW") field in volts per meter (V/m). The fourth column 708 of table 700 can be the effective index associated with the associate parameters.

Figure 8:
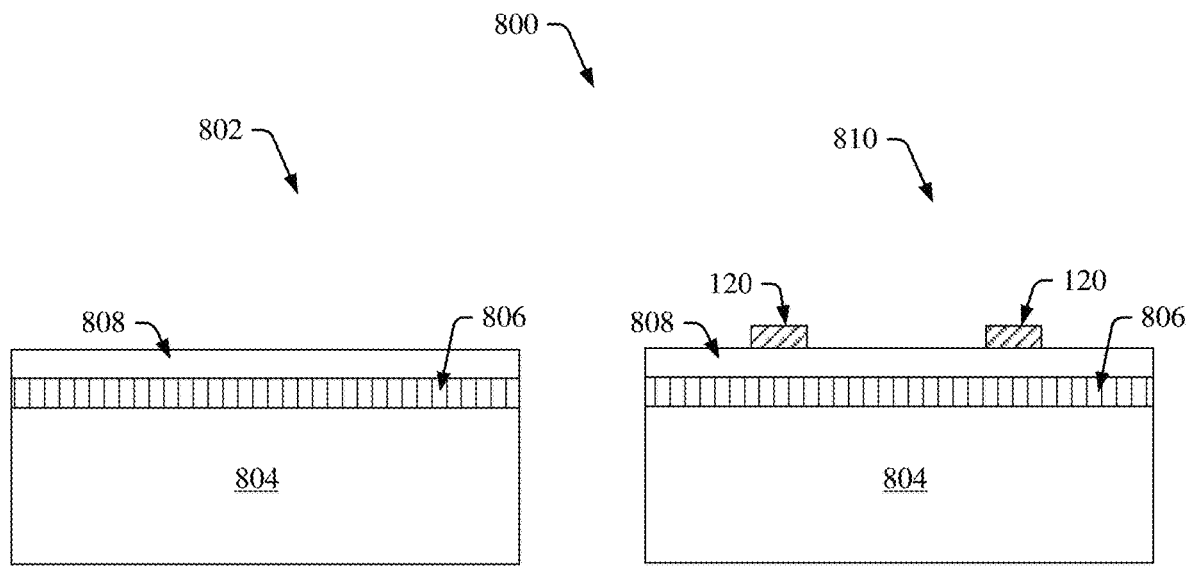
FIG. 8 illustrates a diagram of example, non-limiting stages of manufacturing one or more quantum transducers in accordance with one or more embodiments described herein.
Figure 8:
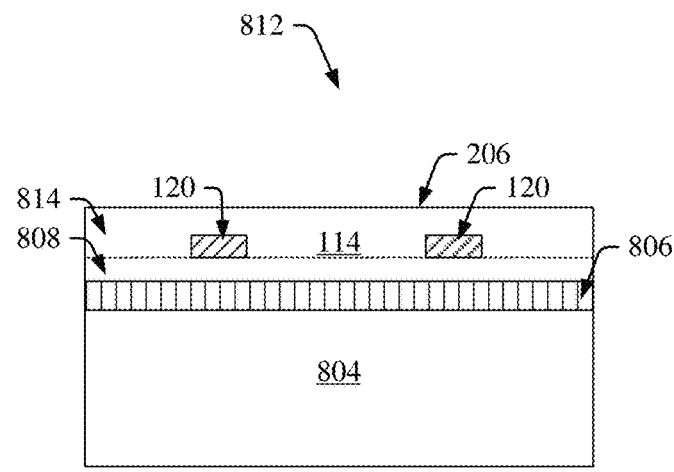
Figure 8:
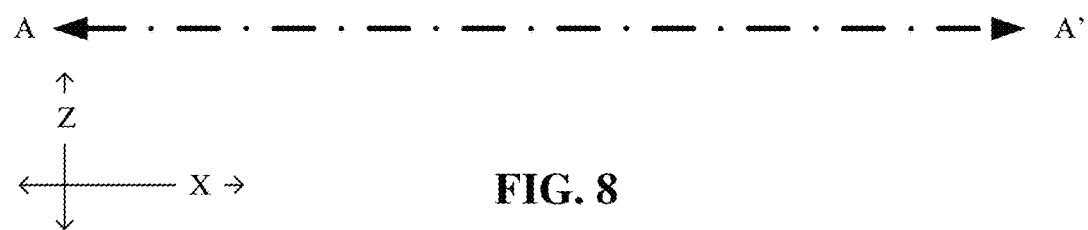

FIG. 8 depicts a diagram of example, non-limiting cross-sectional views of a quantum transducer 100 during multiple stages of a manufacturing process 800 in accordance with one or more embodiments described herein. Repetitive description of like elements employed in other embodiments described herein is omitted for sake of brevity. FIG. 8 can depict a cross-section of the quantum transducer 100 along the A-A' plane depicted in FIG. 1A during various stages of manufacturing. The stages of manufacturing depicted in FIG. 8 can be implemented to manufacture the various quantum transducer 100 embodiments described herein. For example, the stages of manufacturing depicted in FIG. 8 can be implemented to manufacture the quantum transducer 100 comprising one or more microwave resonators 116 having a microstrip architecture, a CPWG TE architecture, a CPWG TM architecture, and/or a twinstrip architecture.

At a first stage 802 of the manufacturing process 800, a SOI wafer can be provided. For example, the SOI wafer can comprise a handle layer 804, a buried oxide layer 806, and/or a device layer 808. For instance, the buried oxide layer 806 can comprise a metal oxide. Also, the handle layer 804 and/or the device layer 808 can comprise the same, or substantially the same, material as the dielectric substrate 114 (e.g., can comprise silicon and/or sapphire). In various embodiments, the device layer 808 can be at least a portion of the dielectric substrate 114. At a second stage 810 of the manufacturing process 800, the one or more optical resonators 120 can be deposited and/or patterned onto the device layer 808. For example, the one or more optical resonators 120 can be grown on the device layer 808 via one or more epitaxial growth processes, where the epitaxial growth can be further patterned via one or more lithography processes to achieve the desired optical resonator 120 dimensions. For instance, the one or more optical resonators 120 can comprise silicon germanium (e.g., $Si_{1-x}Ge_x$, a crystalline alloy of silicon and germanium) grown on the device layer 808 and patterned via one or more lithography processes. In one or more embodiments, lithographic patterning of the epitaxial growth (e.g., patterning of the silicon germanium) can form the one or more optical resonators 120 and/or optical waveguides 104.

At a third stage 812 of the manufacturing process 800, one or more cladding layers 814 can be deposited onto the one or more optical resonators 120 and/or optical waveguides 104 to form the dielectric substrate 114. In one or more embodiments, the one or more cladding layers 814 can be have the same, or substantially same, composition as the dielectric substrate 114 and/or can be gown (e.g., via one or more epitaxial growth processes) on the device layer 808, the one or more optical resonators 120, and/or the one or more optical waveguides 104. For instance, the one or more cladding layers 814 can be one or more grown silicon layers. FIG. 8 depicts a dashed line in the third stage 812 to delineate the location of the device layer 808 and cladding layers 814; thereby, exemplifying the formation of the dielectric substrate 114. Further, at the third stage 812, the one or more cladding layers 814 can be polished (e.g., via CMP) to form the second surface 206 of the dielectric substrate 114.

Figure 9:
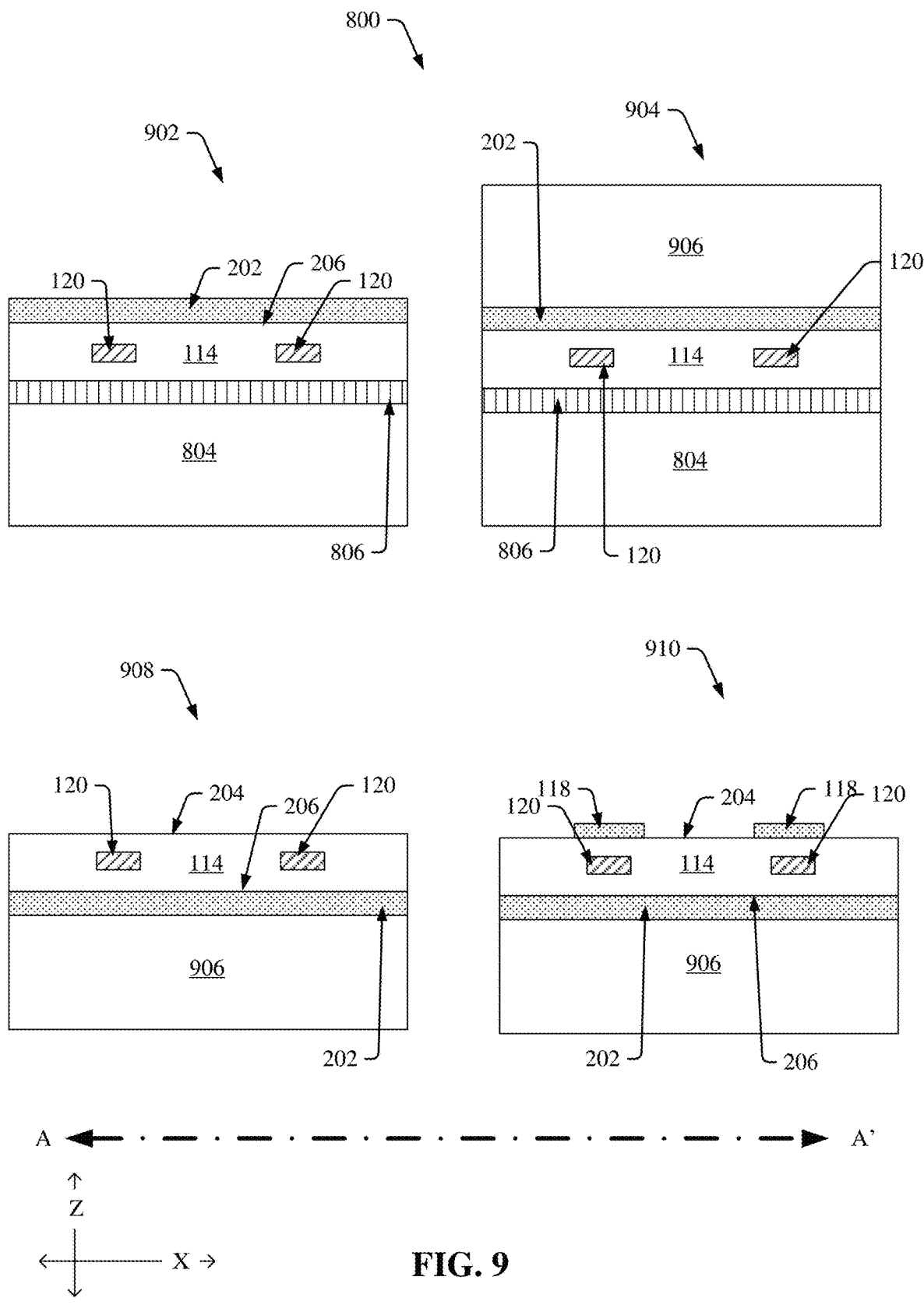
FIG. 9 illustrates a diagram of example, non-limiting stages of manufacturing one or more quantum transducers in accordance with one or more embodiments described herein.

FIG. 9 depicts a diagram of example, non-limiting cross-sectional views of a quantum transducer 100 during multiple stages of the manufacturing process 800 in accordance with one or more embodiments described herein. Repetitive description of like elements employed in other embodiments described herein is omitted for sake of brevity. FIG. 9 can depict a cross-section of the quantum transducer 100 along the A-A' plane depicted in FIG. 1A during various stages of manufacturing. In various embodiments, the stages of manufacturing depicted in FIG. 9 can continue the manufacturing process 800 depicted in FIG. 9.

At a fourth stage 902 of the manufacturing process 800, superconducting material can be deposited (e.g., via one or more deposition processes) onto the second surface 206 of the dielectric substrate 114 via one or more deposition processes to form the superconducting ground plane 202. In one or more embodiments, where the manufacturing process 800 is manufacturing a microwave resonator 116 having a twinstrip architecture, the one or more second superconducting waveguides 502 can be deposited (e.g., via one or more deposition processes) and/or patterned (e.g., via one or more lithography processes) onto the second surface 206 of the dielectric substrate 114 instead of the superconducting ground plane 202. At a fifth stage 904 of the manufacturing process 800, a wafer (e.g., a silicon wafer) can be bonded to the superconducting ground plane 202 to form a second handle layer 906.

At a sixth stage 908 of the manufacturing process 800, the quantum transducer 100 can be flipped, and the handle layer 804 and the buried oxide layer 806 can be removed via one or more etching processes and/or polishing processes (e.g., CMP) to form the first surface 204 of the dielectric substrate 114. At a seventh stage 910 of the manufacturing process 800, superconducting material can be deposited (e.g., via one or more deposition processes) and/or patterned (e.g., via one or more lithography processes) onto the first surface 204 of the first the dielectric substrate 114 to form the one or more superconducting waveguides 118 and/or microwave transmission lines 102. In one or more embodiments, the tenth stage 708 of the first manufacturing process 600 can also comprise depositing (e.g., via the deposition process) and/or patterning (e.g., via the lithography process) one or more second superconducting ground planes 402 onto the first surface 204 of the dielectric substrate 114 to achieve a microwave resonator 116 with a CPWG architecture. Further, the second handle layer 906 can be removed via one or more etching processes to achieve the quantum transducer 100 structure exemplified in FIGS. 1-2 and/or 4-5.

FIG. 10 illustrates a flow diagram of an example, non-limiting method 1000 that can facilitate manufacturing one or more quantum transducers 100 in accordance with one or more embodiments described herein. Repetitive description of like elements employed in other embodiments described herein is omitted for sake of brevity.

At 1002, the method 1000 can comprise forming one or more optical resonators 120 on a dielectric substrate 114. For example, forming the one or more optical resonators at 1002 can be performed in accordance with the first stage 802 and/or second stage 810 of the manufacturing process 800. For instance, a SOI wafer can be provided, where the one or more optical resonators 120 can be deposited (e.g., via one or more deposition processes and/or epitaxial growth processes) onto the device layer 808 of the SOI wafer.

At 1004, the method 1000 can comprise extending the dielectric substrate 114 by depositing one or more dielectric cladding layers 814 onto the dielectric substrate and/or the one or more optical resonators 120. For example, extending the dielectric substrate 114 at 1004 can be performed in accordance with the third stage 812 of the manufacturing process 800. At 1006, the method 1000 can comprise forming one or more superconducting waveguides 118 by depositing a first superconducting material (e.g., niobium, niobium nitride, and/or titanium nitride) onto the dielectric substrate 114, where at least a portion of the dielectric substrate 114 can be positioned between the one or more superconducting waveguides 118 and the one or more optical resonators 120. For example, forming the one or more superconducting waveguides 118 can be performed in accordance with the fourth stage 902, fifth stage 904, sixth stage 908, and/or seventh stage 910 of the manufacturing process 800. In various embodiments, the method 1000 can further comprise forming a superconducting ground plane 202 or one or more second superconducting waveguides 502 on the dielectric substrate 114. For example, the method 1000 can facilitate manufacturing quantum transducers 100 comprising one or more microwave resonators 116 having microstrip, twinstrip, and/or CWPG architectures in accordance with the various embodiments described herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a superconducting microwave resonator having a microstrip architecture that includes a dielectric substrate positioned between a superconducting waveguide and a ground plane; and
   an optical resonator positioned within the dielectric substrate.

2. The apparatus of claim 1, wherein the superconducting waveguide and the ground plane comprise at least one element selected from a group consisting of niobium, niobium nitride, and titanium nitride.

3. The apparatus of claim 2, wherein the dielectric substrate comprises at least one element selected from a group consisting of silicon, sapphire, and garnet.

4. The apparatus of claim 3, wherein the optical resonator includes an optical waveguide that comprises at least one material selected from a group consisting of silicon germanium, lithium niobate, and aluminum nitride.

5. The apparatus of claim 1, wherein the dielectric substrate is positioned between the superconducting waveguide and the optical resonator, and wherein the dielectric substrate is further positioned between the ground plane and the optical resonator.

6. The apparatus of claim 1, further comprising a second ground plane that is co-planer with the superconducting waveguide and positioned on the dielectric substrate.

7. The apparatus of claim 6, wherein the second ground plane comprises at least one element selected from a group consisting of niobium, niobium nitride, and titanium nitride.

8. The apparatus of claim 6, wherein the dielectric substrate extends from the ground plane to the superconducting waveguide along a direction, and wherein a position of the optical resonator within the dielectric substrate is offset from a position of the superconducting waveguide on the dielectric substrate along the direction.

9. An apparatus, comprising:
   a superconducting microwave resonator having a twin-strip architecture that includes a dielectric substrate positioned between a first superconducting waveguide and a second superconducting waveguide; and
   an optical resonator positioned within the dielectric substrate.

10. The apparatus of claim 9, wherein the first superconducting waveguide and the second superconducting waveguide comprise at least one element selected from a group consisting of niobium, niobium nitride, and titanium nitride.

11. The apparatus of claim 10, wherein the dielectric substrate comprises at least one element selected from a group consisting of silicon, sapphire, and garnet.

12. The apparatus of claim 11, wherein the optical resonator includes an optical waveguide that comprises at least one material selected from a group consisting of silicon germanium, lithium niobate, and aluminum nitride.

13. The apparatus of claim 12, wherein the dielectric substrate is positioned between the first superconducting waveguide and the optical resonator and between the second superconducting waveguide and the optical resonator.

* * * * *